United States Patent
Goto et al.

(10) Patent No.: US 11,011,785 B2
(45) Date of Patent: May 18, 2021

(54) ELECTRICITY STORAGE DEVICE TESTING METHOD AND ELECTRICITY STORAGE DEVICE MANUFACTURING METHOD

(71) Applicant: TOYOTA JIDOSHA KABUSHIKI KAISHA, Toyota (JP)

(72) Inventors: Takeshi Goto, Kasugai (JP); Kiwamu Kobayashi, Anjo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 35 days.

(21) Appl. No.: 16/447,531

(22) Filed: Jun. 20, 2019

(65) Prior Publication Data

US 2020/0067147 A1 Feb. 27, 2020

(30) Foreign Application Priority Data

Aug. 21, 2018 (JP) .............................. JP2018-154699

(51) Int. Cl.
*H01M 10/48* (2006.01)
*G01R 31/3842* (2019.01)

(52) U.S. Cl.
CPC ........ *H01M 10/48* (2013.01); *G01R 31/3842* (2019.01)

(58) Field of Classification Search
CPC .......... G01R 19/19542; G01R 31/3842; G01R 31/3865; G01R 31/389; G01R 31/392; G01R 31/50; H01M 10/48
See application file for complete search history.

(56) References Cited

U.S. PATENT DOCUMENTS

| 5,686,815 | A  | * | 11/1997 | Reipur ................. | H02J 7/0091 |
| | | | | | 320/116 |
| 2002/0008523 | A1 | * | 1/2002 | Klang ............... | H02J 7/007194 |
| | | | | | 324/429 |
| 2009/0309547 | A1 | * | 12/2009 | Nakatsuji ................. | H02J 7/06 |
| | | | | | 320/134 |
| 2012/0130661 | A1 | * | 5/2012 | Hagimori ........... | G01R 31/3842 |
| | | | | | 702/63 |

(Continued)

FOREIGN PATENT DOCUMENTS

JP 2010-153275 A 7/2010

OTHER PUBLICATIONS

U.S. Appl. No. 16/182,683 filed Nov. 7, 2018 in the name of Kiwamu Kobayashi et al.

*Primary Examiner* — Steven L Yeninas
(74) *Attorney, Agent, or Firm* — Oliff PLC

(57) ABSTRACT

Provided is an electricity storage device testing method including: building a closed circuit by connecting an external power source to a charged electricity storage device such that the direction of voltage of the external power source is opposite from that of the electricity storage device; measuring a circuit current while applying to the closed circuit a voltage in an opposite direction from a voltage of the electricity storage device by the external power source; calculating a voltage to be output by the external power source, based on the value of the circuit current measured and a resistance value of the closed circuit. The output voltage of the external power source is changed according to a result of the calculation. A time interval at which the calculation is set to be shorter at an early stage and longer at a late stage of the measuring.

4 Claims, 12 Drawing Sheets

(56) References Cited

U.S. PATENT DOCUMENTS

| | | | |
|---|---|---|---|
| 2014/0266229 A1* | 9/2014 | McCoy | G01R 31/396 |
| | | | 324/434 |
| 2017/0153290 A1* | 6/2017 | Sazhin | G01R 31/3648 |
| 2018/0164363 A1* | 6/2018 | Brorein | G01R 31/52 |
| 2018/0313903 A1* | 11/2018 | Hindle | H01M 10/4285 |
| 2019/0056457 A1* | 2/2019 | Li | H01M 10/486 |

\* cited by examiner

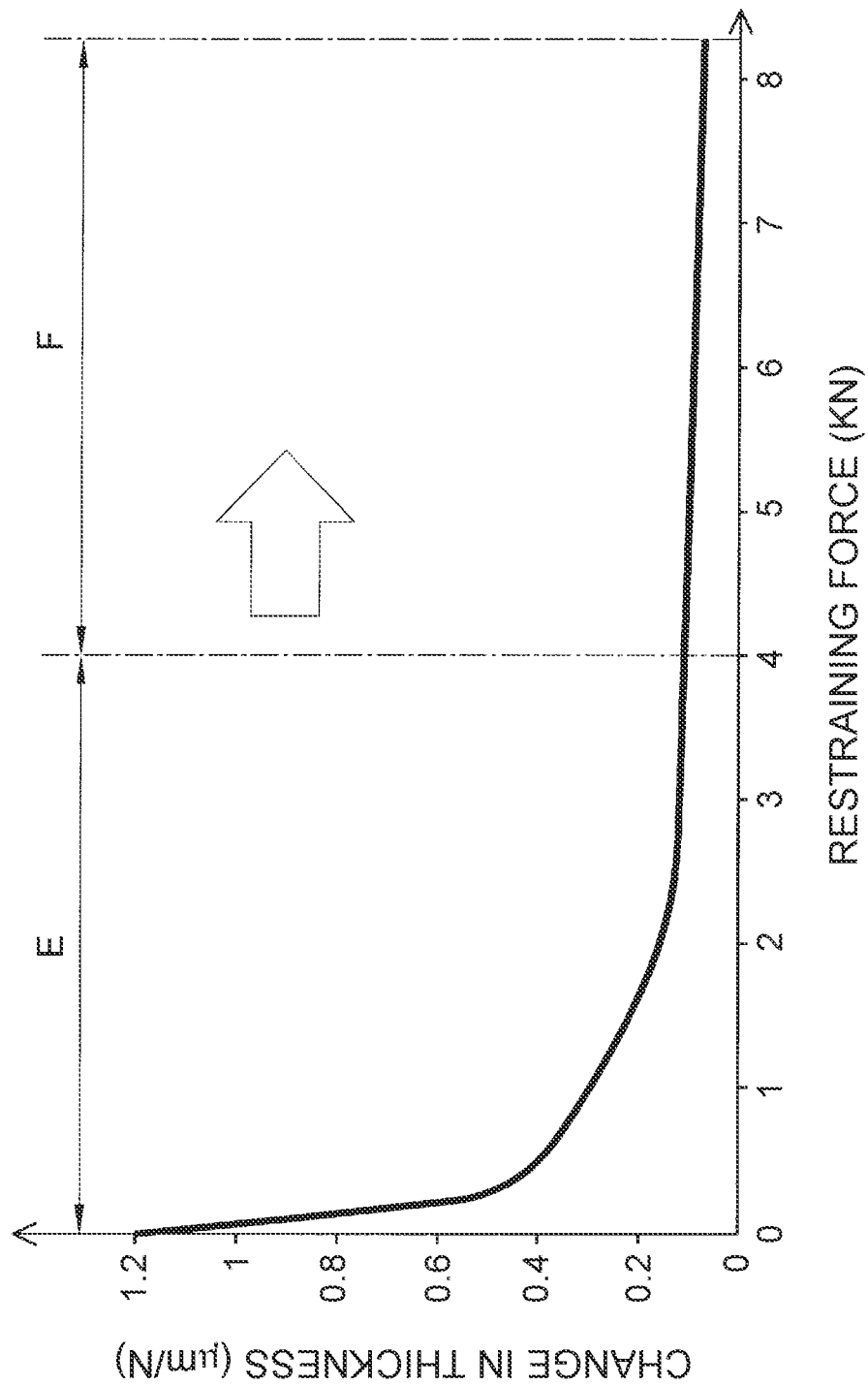

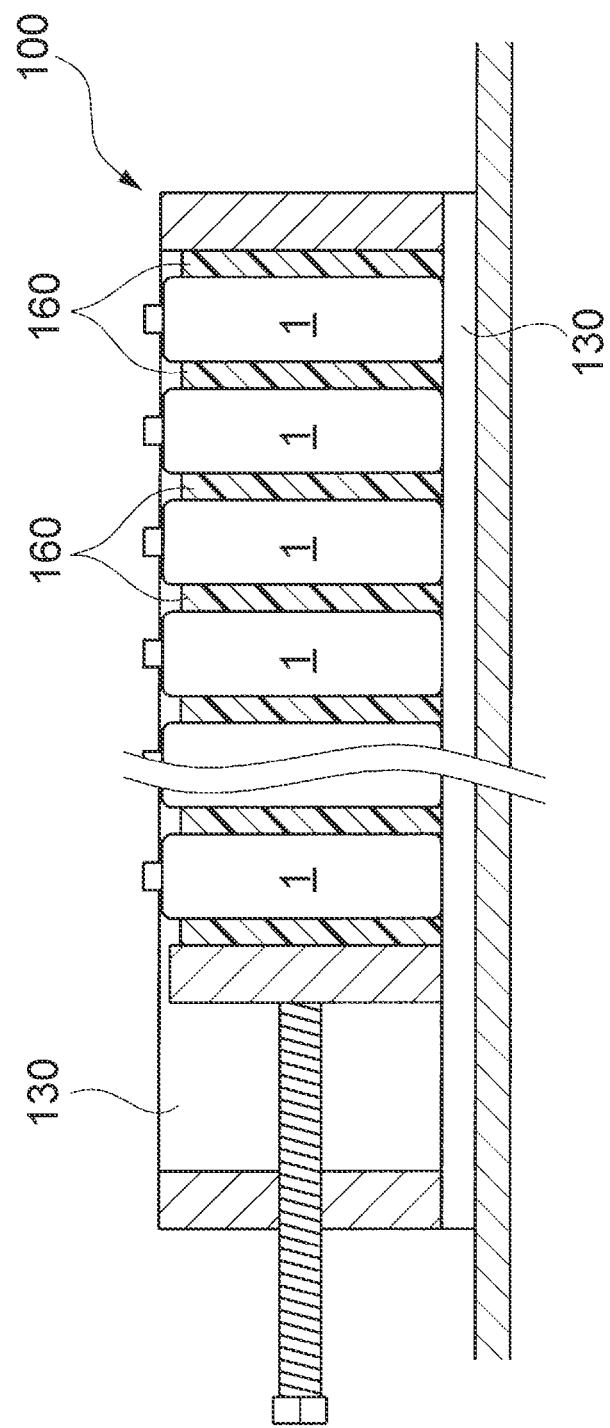

ELECTRICITY STORAGE DEVICE TESTING METHOD AND ELECTRICITY STORAGE DEVICE MANUFACTURING METHOD

INCORPORATION BY REFERENCE

The disclosure of Japanese Patent Application No. 2018-154699 filed on Aug. 21, 2018 including the specification, drawings and abstract is incorporated herein by reference in its entirety.

BACKGROUND

1. Technical Field

The present disclosure relates to a testing method for determining whether or not an electricity storage device is defective. More particularly, the present disclosure relates to an electricity storage device testing method by which whether or not an electricity storage device is defective can be quickly determined based on an amount of discharge current, not an amount of voltage decrease, of the device. A further subject of the present disclosure is an electricity storage device manufacturing method that includes this electricity storage device testing method as part of the process.

2. Description of Related Art

Various testing methods for determining whether or not secondary batteries and other electricity storage devices are defective have been proposed. One example is Japanese Patent Application Publication No. 2010-153275, in which a let-stand step of letting a secondary battery to be determined stand in a pressurized state, and the battery voltage is measured before and after the let-stand step. The difference between the battery voltages before and after the let-stand step corresponds to an amount of voltage decrease resulting from letting the secondary battery stand. A large amount of voltage decrease means that the battery self-discharges a large amount of current. Thus, this method can determine whether or not a secondary battery is defective based on whether the amount of voltage decrease is large or small. Such a testing method is sometimes performed as a step of a manufacturing method.

SUMMARY

The above method of determining whether or not a secondary battery is defective has the following problem. The defective-or-not-defective determination is time-consuming. This is because such an amount of voltage decrease as can be deemed significant cannot be reached without allowing a long let-stand time in the let-stand step. This is partially attributable to the rather poor accuracy of voltage measurement. Voltage measurement is inevitably affected by a voltage decrease that occurs along a current application path during measurement. Moreover, each time the terminals of a secondary battery and the terminals of a measuring instrument are connected to each other, the contact positions vary slightly, causing variations in the extent of voltage decrease among measurements. It is then conceivable to use current measurement instead of voltage measurement to thereby shorten the measurement time of an amount of self-discharge and increase the measurement accuracy. Unlike voltage measurement, current measurement is hardly affected by the contact positions because the current is constant throughout the circuit. However, simply substituting current measurement for voltage measurement cannot achieve an appropriate determination.

The present disclosure provides an electricity storage device testing and manufacturing methods by which whether or not an electricity storage device is defective can be quickly determined with high accuracy.

A first aspect of the present disclosure relates to a testing method in which whether or not an electricity storage device being tested is defective is determined based on a value of a current flowing through a closed circuit built by connecting a power source to the electricity storage device. This testing method includes: a circuit building step of building the closed circuit by connecting an external power source to a charged electricity storage device such that a direction of voltage of the external power source is opposite from a direction of voltage of the electricity storage device; a current measuring step of measuring the value of the current flowing through the closed circuit while applying to the closed circuit a voltage in the opposite direction from the direction of voltage of the electricity storage device by the external power source; and a feedback computing step of calculating a voltage to be output by the external power source in the current measuring step, based on the value of the current measured in the current measuring step and a resistance value of the closed circuit. In the current measuring step, the output voltage of the external power source is changed according to the calculated voltage in the feedback computing step. A time interval at which the voltage to be output is calculated in the feedback computing step is set to be shorter at an early stage of the current measuring step and longer at a late stage of the current measuring step.

In the electricity storage device testing method of the above aspect, whether or not an electricity storage device is defective is determined by measuring a current in the closed circuit including the electricity storage device, instead of measuring the voltage of the electricity storage device. Since current measurement has higher accuracy than voltage measurement, a determination based on current measurement has also higher accuracy. In particular, in this aspect, the current in the closed circuit is measured while the output voltage of the external power source is applied to the closed circuit, so that whether the amount of self-discharge of the electricity storage device is large or small is reflected in the state of convergence of the current. It is therefore possible to determine with high accuracy whether the amount of self-discharge is large (defective) or small (not defective) based on the state of convergence of the current. Here, in this embodiment, convergence of the current in the closed circuit is accelerated by performing the feedback computation and changing the output voltage of the external power source accordingly based on the value of the current and the resistance value of the closed circuit. This allows for a quick determination. The feedback frequency is set to be higher at the early stage of the current measuring step and lower at the late stage of the current measuring step. This makes it possible to take full advantage of the convergence promoting effect of the feedback, and at the same time to reduce the risk of divergence of the current.

In the above electricity storage device testing method, the time of transition from the early stage to the late stage in the current measuring step may be time that is earlier than time at which the value of the current is expected to converge when the voltage to be output is calculated in the feedback computing step on a non-defective electricity storage device at the time interval of the early stage. Thus, the feedback frequency can be reduced before the risk of divergence of the current increases.

The above electricity storage device testing method may further include an output voltage setting step of, before starting the current measuring step, setting an initial output voltage of the external power source so as to match an initial voltage of the electricity storage device as a target. Thus, a situation can be avoided in which the initial output voltage of the external power source is so low that it takes a long time for the current in the closed circuit to converge. A situation can also be avoided in which the initial output voltage of the external power source is so high that the current in the closed circuit diverges.

A second aspect of the present disclosure relates to an electricity storage device manufacturing method including: an initial charging step of obtaining a charged electricity storage device by initially charging an assembled and uncharged electricity storage device until a predetermined state of charge is reached; and a testing step of testing the charged electricity storage device. In the testing step, the electricity storage device testing method of the first aspect is performed.

Thus configured, the present disclosure provides electricity storage device testing and manufacturing methods by which whether or not an electricity storage device is defective can be quickly determined with high accuracy.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 11 is a graph showing a relation between a restraining force and the thickness of a battery; and FIG. 12 is a schematic view showing a state where a plurality of secondary batteries being tested is bound along with spacers by a binding member to form a bound assembly.

DETAILED DESCRIPTION OF EMBODIMENTS

Figure 1:
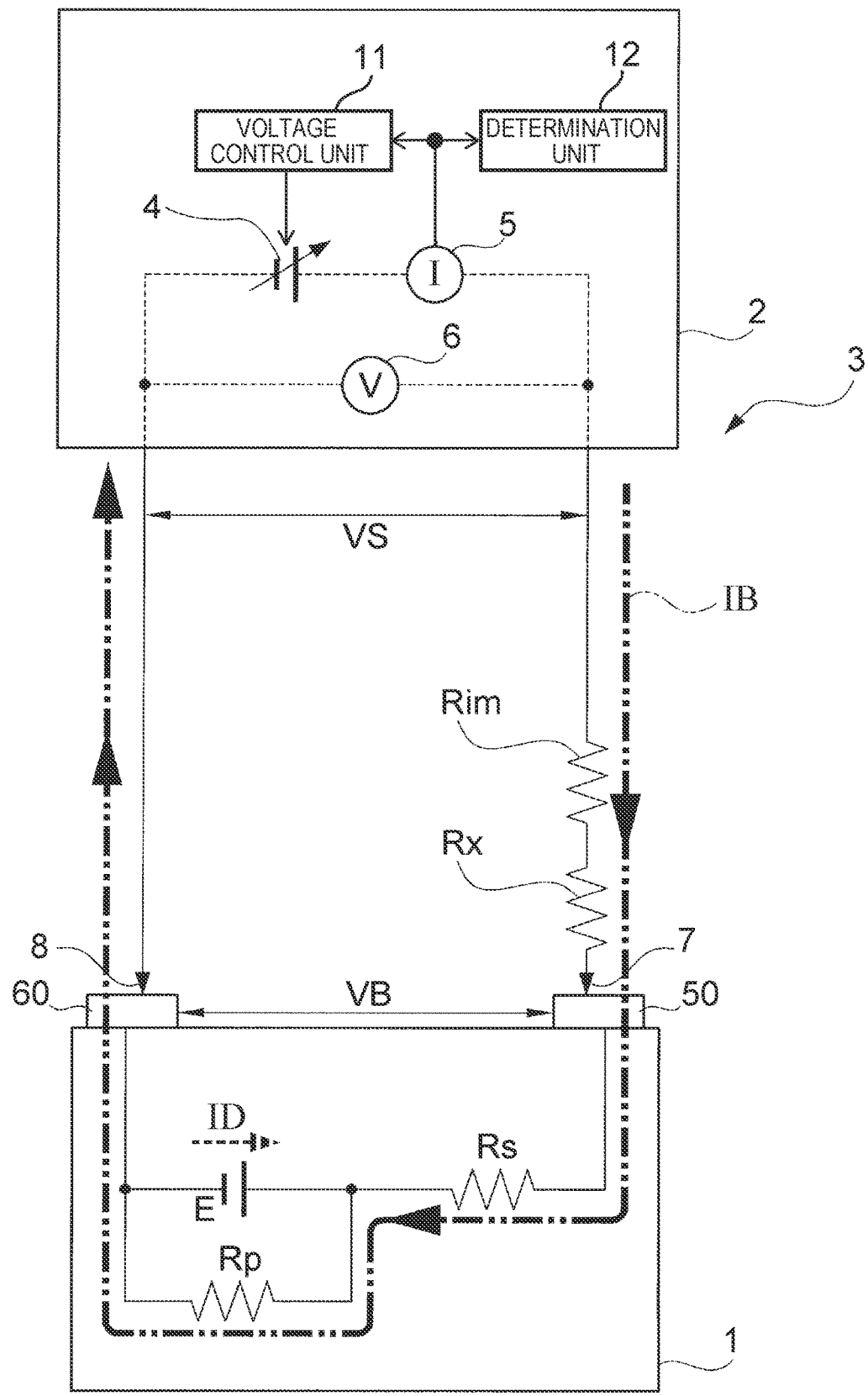
FIG. 1 is a circuit diagram showing the configuration of a circuit formed to perform a secondary battery testing method in an embodiment.

In the following, an embodiment that embodies the present disclosure will be described in detail with reference to the accompanying drawings. As shown in FIG. 1, an electricity storage device testing method of this embodiment is performed in a state where a circuit 3 is formed by connecting a measurement device 2 to a secondary battery 1 that is an electricity storage device being tested. First, the basic principle of the testing method of the secondary battery 1 using the measurement device 2 will be described.

Basic Principle

Figure 2:
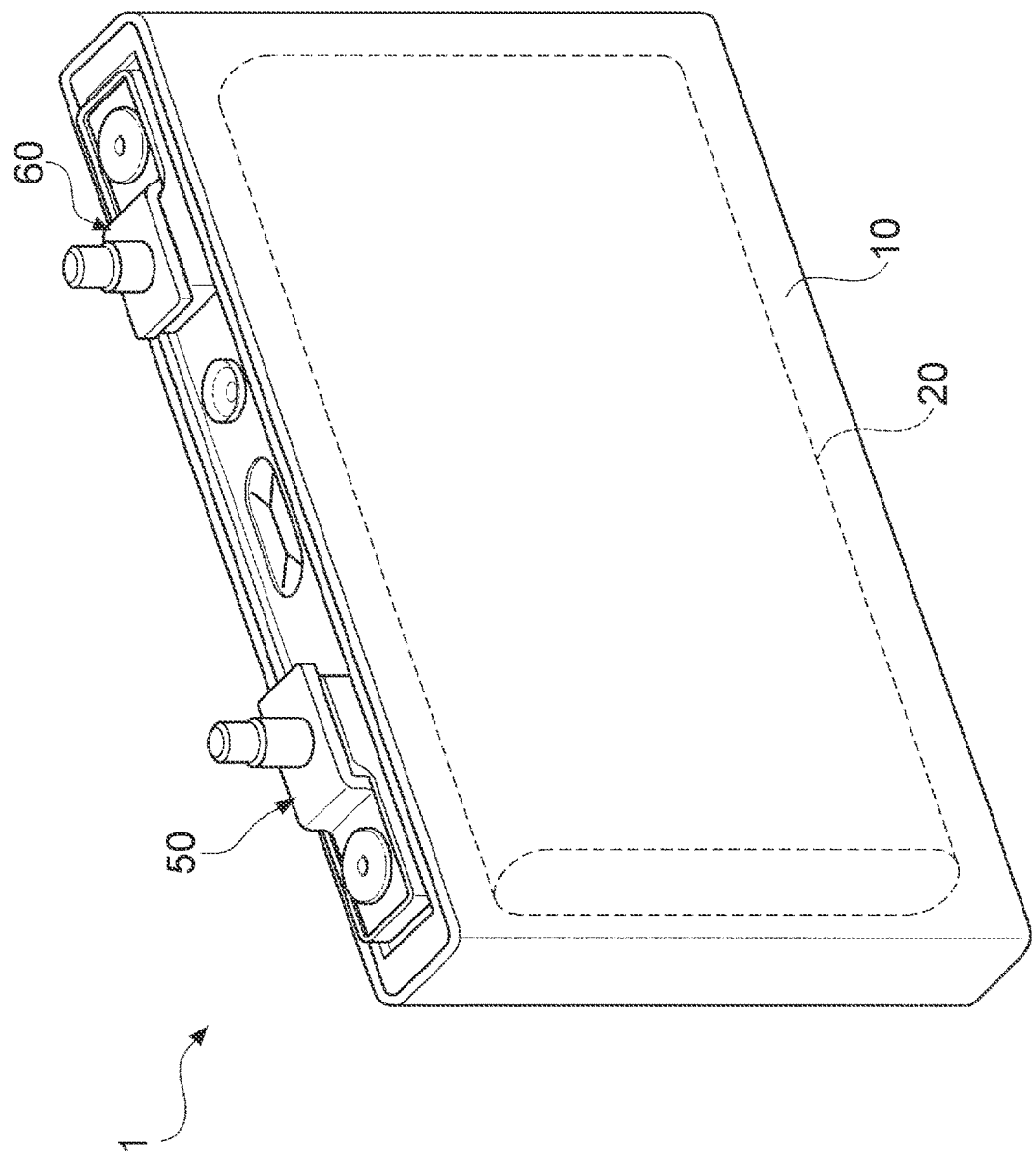
FIG. 2 is an external view showing an example of a secondary battery being tested in the embodiment.

The secondary battery 1 that is schematically shown in FIG. 1 actually has, for example, a flat rectangular appearance as shown in FIG. 2. The secondary battery 1 of FIG. 2 is formed by enclosing an electrode stack 20 in an outer casing 10. The electrode stack 20 is a stack of a positive electrode plate and a negative electrode plate with a separator in between. Other than the electrode stack 20, an electrolyte is also contained inside the outer casing 10. Positive and negative terminals 50, 60 are provided on an outer surface of the secondary battery 1. The secondary battery 1 is not limited to the flat rectangular one as shown in FIG. 2 but may have another shape, such as a cylindrical shape.

FIG. 1 schematically shows the secondary battery 1. The secondary battery 1 in FIG. 1 is represented as a model composed of an electromotive element E, an internal resistance Rs, and a short-circuit resistance Rp. The internal resistance Rs is disposed in series with the electromotive element E. The short-circuit resistance Rp is a model of a conductive path formed by a small metallic foreign object that can sometimes enter the electrode stack 20, and is disposed parallel to the electromotive element E.

The measurement device 2 has a direct-current power source 4, an ammeter 5, a voltmeter 6, and probes 7, 8. The ammeter 5 is disposed in series with the direct-current power source 4, while the voltmeter 6 is disposed parallel to the direct-current power source 4. An output voltage VS of the direct-current power source 4 is variable. The direct-current power source 4 is used to apply the output voltage VS to the secondary battery 1 as will be described later. The ammeter 5 measures a current flowing through the circuit 3. The voltmeter 6 measures a voltage across the probes 7, 8. In FIG. 1, the circuit 3 that is a closed circuit is built by respectively connecting the probes 7, 8 of the measurement device 2 to the terminals 50, 60 of the secondary battery 1. The direct-current power source 4 may be a power source that has a built-in electricity generation function and outputs a direct-current voltage, or may be a power source that is supplied with electricity from outside, converts the electricity as appropriate, and outputs a direct-current voltage.

The measurement device 2 is further provided with a voltage control unit 11 and a determination unit 12. The voltage control unit 11 controls the output voltage of the direct-current power source 4. The determination unit 12 determines whether or not the secondary battery 1 is defective based on a measurement value of the ammeter 5. The functions of the voltage control unit 11 and the determination unit 12 will be described in detail later. An imaginary resistance Rim in FIG. 1 will also be described later. For the time being, the imaginary resistance Rim will be disregarded in the description.

Figure 3:
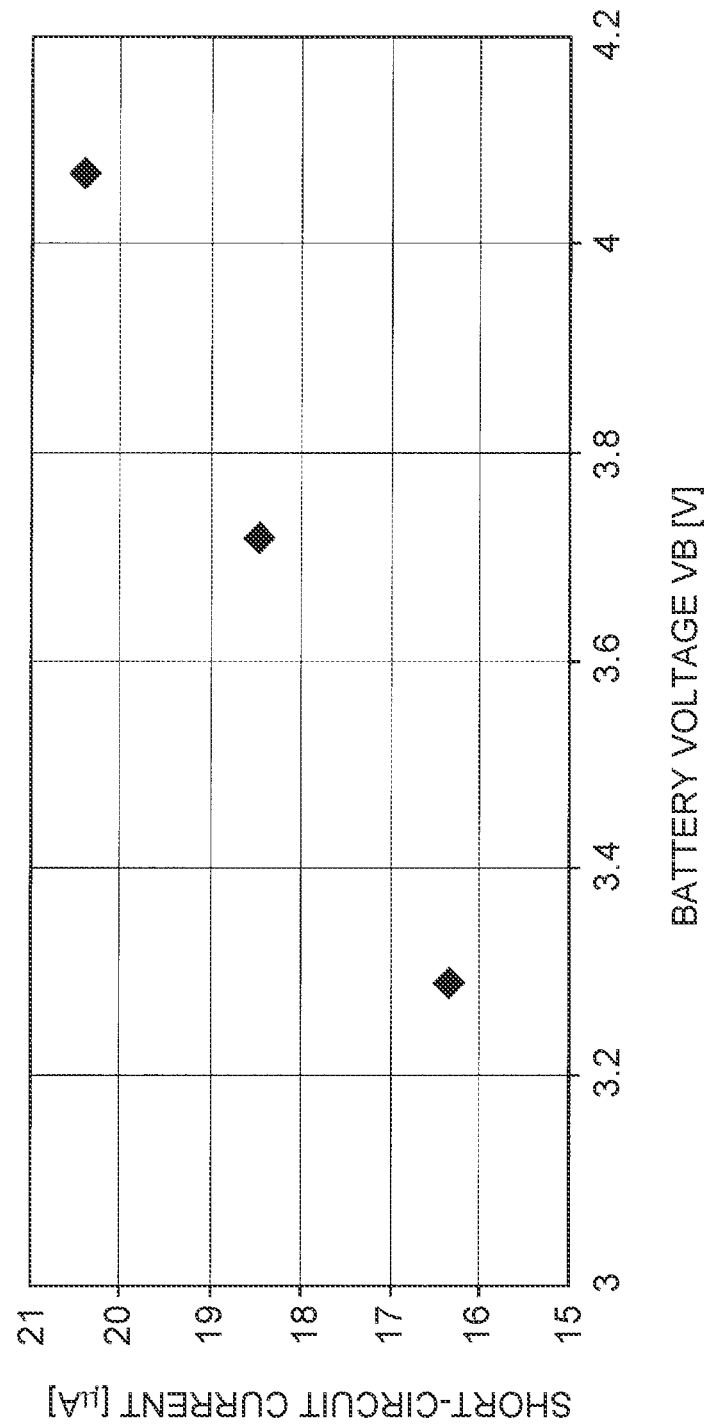
FIG. 3 is a graph showing a relation between a battery voltage and a short-circuit current.

In the testing method using the measurement device 2, whether the amount of self-discharge of the secondary battery 1 is large or small is tested. The secondary battery 1 is defective if the amount of self-discharge is large and not defective if the amount of self-discharge is small. For this purpose, first, an assembled, uncharged secondary battery 1 is initially charged until a predetermined state of charge is reached, before being connected to the circuit 3. Then, the charged secondary battery 1 is connected to the circuit 3, and in this state, the amount of self-discharge of the secondary battery 1 is calculated by the measurement device 2. Based on the calculation result, it is determined whether or not the secondary battery 1 is defective. The secondary battery 1 is thus charged before the test, because the amount of self-discharge of the secondary battery 1 is affected by a battery voltage VB of the secondary battery 1. Specifically, as shown in FIG. 3, the higher the battery voltage VB, the larger the amount of self-discharge (short-circuit current). To determine with high accuracy whether or not the secondary battery 1 is defective based on the value of a self-discharge current, therefore, it is advantageous to perform the test in a state where the amount of self-discharge is large, i.e., a state where the battery voltage VB is high.

Figure 4:
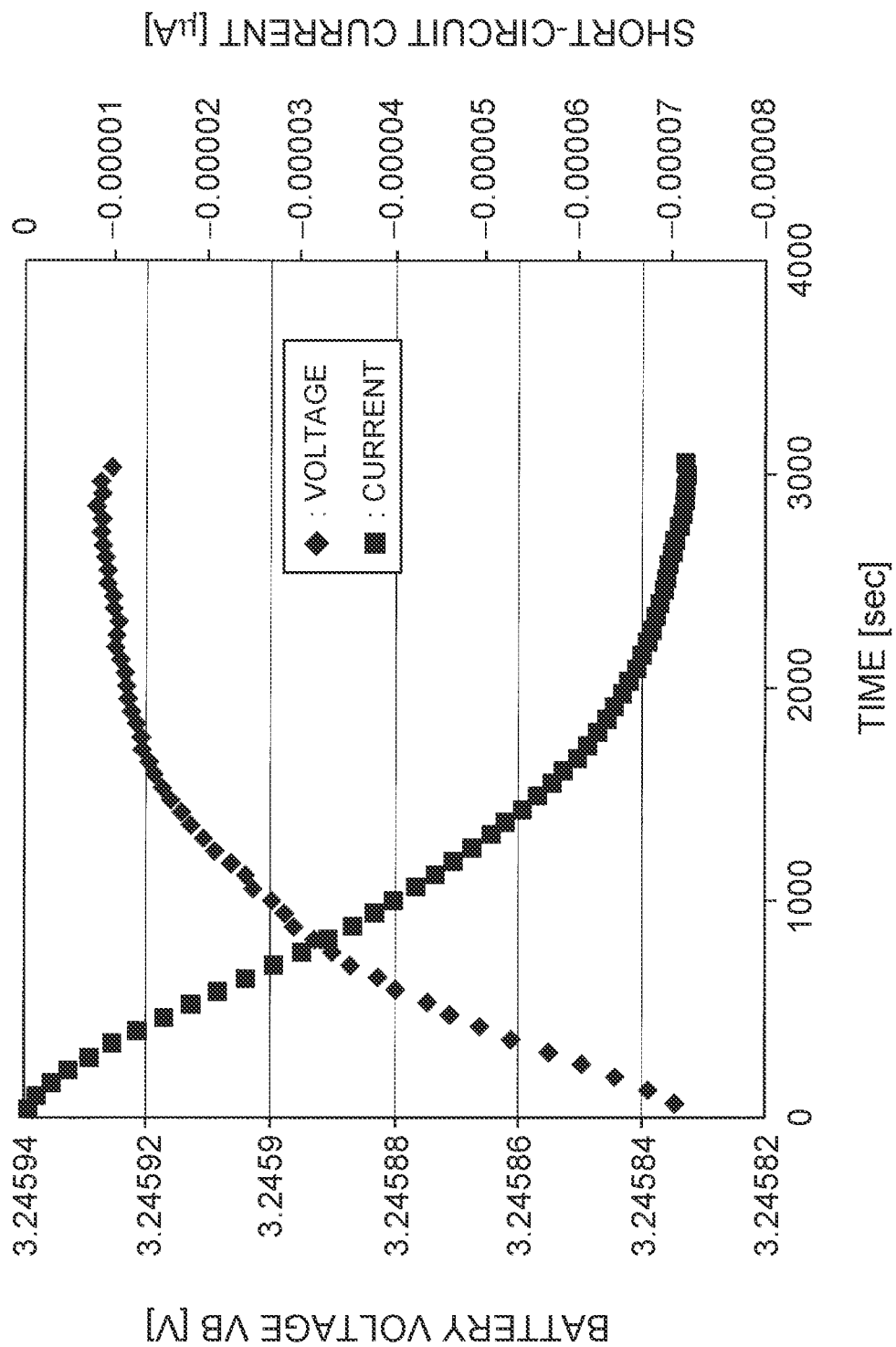
FIG. 4 is a graph showing changes in battery voltage and short-circuit current after charge.

Specifically, the charged secondary battery 1 is connected to the circuit 3. In this case, the charged secondary battery 1 to be connected to the circuit 3 is a secondary battery for which high-temperature aging that is usually performed after charge has been completed and of which the battery voltage has stabilized. This is because the battery voltage VB of the secondary battery 1 is unstable after charge. Specifically, as shown in FIG. 4, the battery voltage VB (and the short-circuit current) changes during a time shortly after charge and does not stabilize until about one hour later. If the test is started with the battery voltage VB thus changing, an incorrect determination may be made due to the changing battery voltage VB. Here, the changes in short-circuit current shown in FIG. 4 are caused by internal factors of the secondary battery 1, and are a phenomenon different from an increase in a circuit current IB shown in FIG. 8, to be described later, that is obtained as a result of measurement in the test of the embodiment. Therefore, the test is performed after the battery voltage VB is quickly stabilized by high-temperature aging.

FIG. 3 and FIG. 4 each show an example of measurement in which the battery type of the secondary battery 1 is a lithium-ion secondary battery. The test itself of the embodiment is performed at room temperature. When the secondary battery 1 has been connected to the circuit 3, first, the output voltage VS of the measurement device 2 is adjusted such that the ammeter 5 reads zero. The output voltage VS in this case matches an initial battery voltage VB1 that is an initial value of the battery voltage VB of the secondary battery 1.

In this state, the output voltage VS matches the initial battery voltage VB1, and the output voltage VS and the battery voltage VB of the secondary battery 1 are in the opposite directions. Thus, these voltages cancel each other, which results in zero circuit current IB in the circuit 3. The secondary battery 1 is then let stand with the output voltage VS of the measurement device 2 maintained to be constant at the initial battery voltage VB1.

Figure 5:
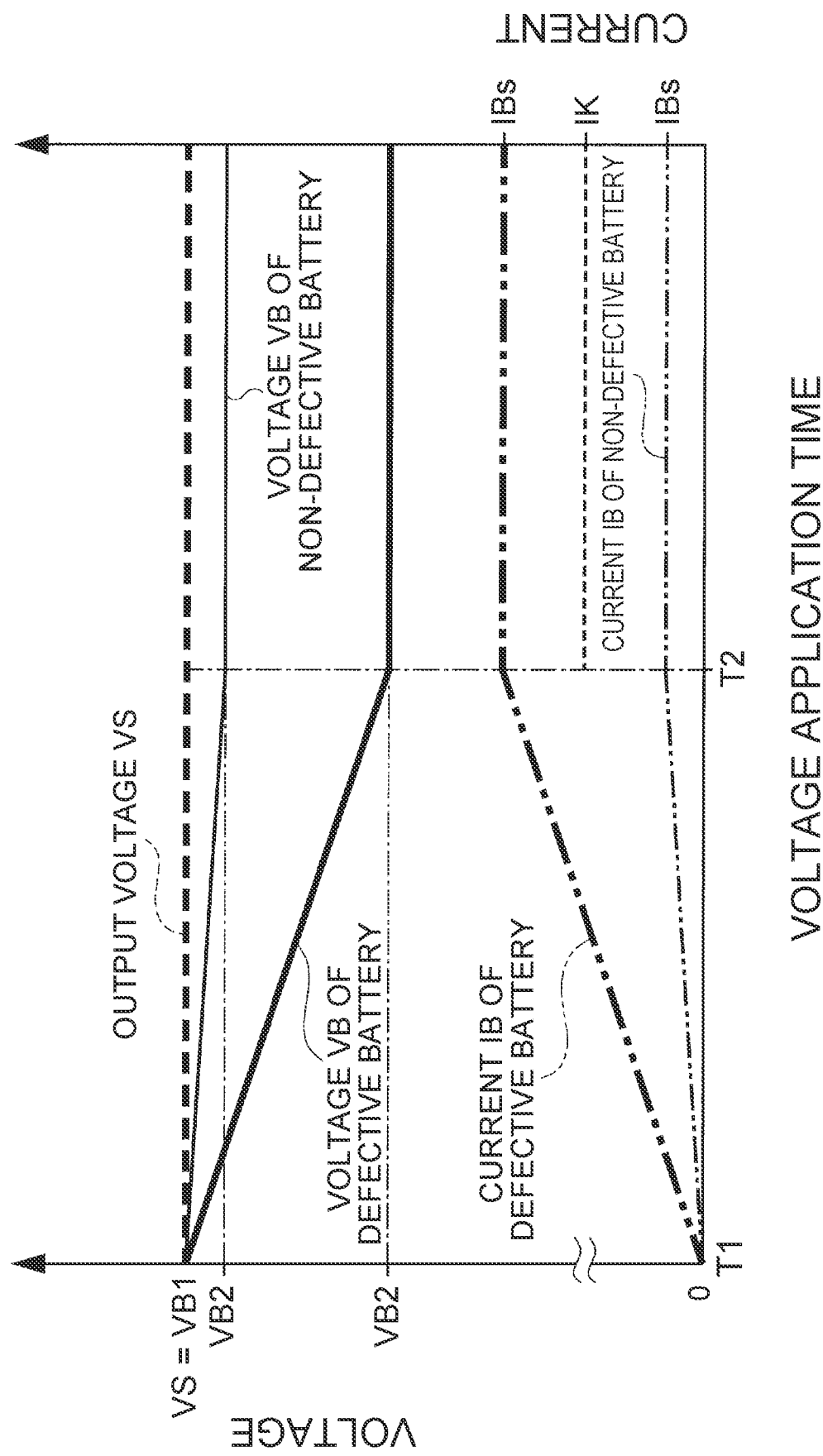
FIG. 5 is a graph showing changes over time in voltage and current in a test of the embodiment.

FIG. 5 shows the subsequent state of the circuit 3. In FIG. 5, the horizontal axis represents time and the vertical axes represent voltage (left side) and current (right side). For the time on the horizontal axis, time T1 at the left end in FIG. 5 is time when application of the output voltage VS equal to the initial battery voltage VB1 as described above is started. After time T1, the battery voltage VB decreases gradually from the initial battery voltage VB1 due to self-discharge of the secondary battery 1. As a result, the balance between the output voltage VS and the battery voltage VB is lost and the circuit current IB starts to flow in the circuit 3. The circuit current IB increases gradually from zero. The circuit current IB is directly measured by the ammeter 5. When time T2 later than time T1 is reached, both the decrease in the battery voltage VB and the increase in the circuit current IB level off, so that both the battery voltage VB and the circuit current IB subsequently remain constant (VB2, IBs).

As is clear from FIG. 5, both the increase in the circuit current IB and the decrease in the battery voltage VB are more rapid in a defective secondary battery 1 than in a non-defective secondary battery 1. Accordingly, the circuit current IBs upon convergence in the defective secondary battery 1 is higher than the circuit current IBs upon convergence in the non-defective secondary battery 1. Moreover, the battery voltage VB2 upon convergence in the defective secondary battery 1 is lower than the battery voltage VB2 upon convergence in the non-defective secondary battery 1.

The reason why the circuit 3 assumes the state as shown in FIG. 5 after time T1 will be described. First, the cause for the decrease in the battery voltage VB is self-discharge of the secondary battery 1 as described above. As a result of self-discharge, a self-discharge current ID flows through the electromotive element E of the secondary battery 1. The self-discharge current ID is higher when the amount of self-discharge of the secondary battery 1 is large and lower when the amount of self-discharge is smaller. The self-discharge current ID tends to be higher in a secondary battery 1 that has a lower value of the short-circuit resistance Rp. For example, if a metallic foreign object is contained inside the secondary battery 1, this battery is of course defective. Such a battery has a high self-discharge current ID and therefore can be determined by the above-described method.

On the other hand, the circuit current IB that flows after time T1 as the battery voltage VB decreases is a current in a direction in which the secondary battery 1 is charged. Thus, the circuit current IB acts in a direction in which self-discharge of the secondary battery 1 is prevented, and this direction is opposite from the self-discharge current ID inside the secondary battery 1. When the circuit current IB increases to be equal to the self-discharge current ID, self-discharge virtually stops. This is at time T2. Therefore, both the battery voltage VB and the circuit current IB subsequently remain constant (VB2, IBs). Whether or not the circuit current IB has converged can be determined by a known technique. For example, the value of the circuit current IB may be sampled with appropriate frequency, and when changes in the value become smaller than a predetermined reference, the circuit current IB may be determined to have converged.

Here, the circuit current IB can be ascertained directly as a reading of the ammeter 5 as described above. Therefore, whether or not the secondary battery 1 is defective can be determined by setting in advance a reference value IK for the circuit current IBs upon convergence. If the circuit current IBs upon convergence is higher than the reference value IK, this means that the secondary battery 1 is a defective product that self-discharges a large amount of current, whereas if the circuit current IBs upon convergence is lower than the reference value IK, this means that the secondary battery 1 is a non-defective product that self-discharges a small amount of current.

The processing time required for this determination method (time T1 to time T2) is shorter than the let-stand time in the technique described in BACKGROUND. While the output voltage VS is held constant at the initial battery voltage VB1 in FIG. 5, gradually increasing the output voltage VS from the initial battery voltage VB1 after time T1 can further reduce the required processing time. Determining whether or not the secondary battery 1 is defective based on the battery voltage VB2 upon convergence shown in FIG. 5 is not a recommended means. This is because the battery voltage VB does not always accurately appear as a reading of the voltmeter 6. Here concludes the description of the basic principle of the testing method of the secondary battery 1 using the measurement device 2.

Feedback

In the foregoing description, the output voltage VS of the measurement device 2 has been held constant. However, this does not mean that the output voltage VS must be constant. On the contrary, appropriately changing the output voltage VS under the control of the voltage control unit 11 can further reduce the processing time required for determination. This will be described below.

Figure 6:
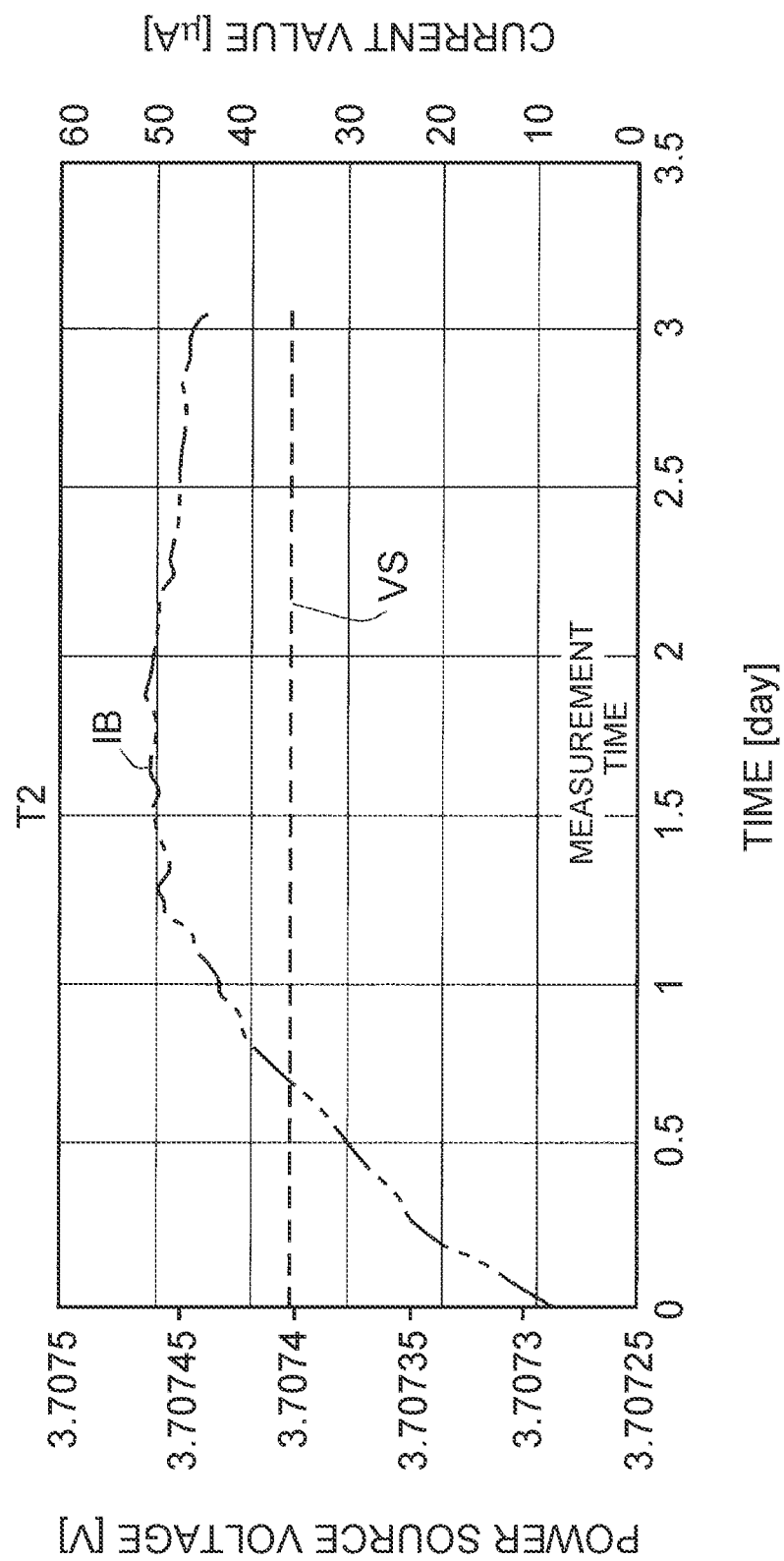
FIG. 6 is a graph showing an example of the shift of a circuit current when an output voltage is held constant.
Figure 7:
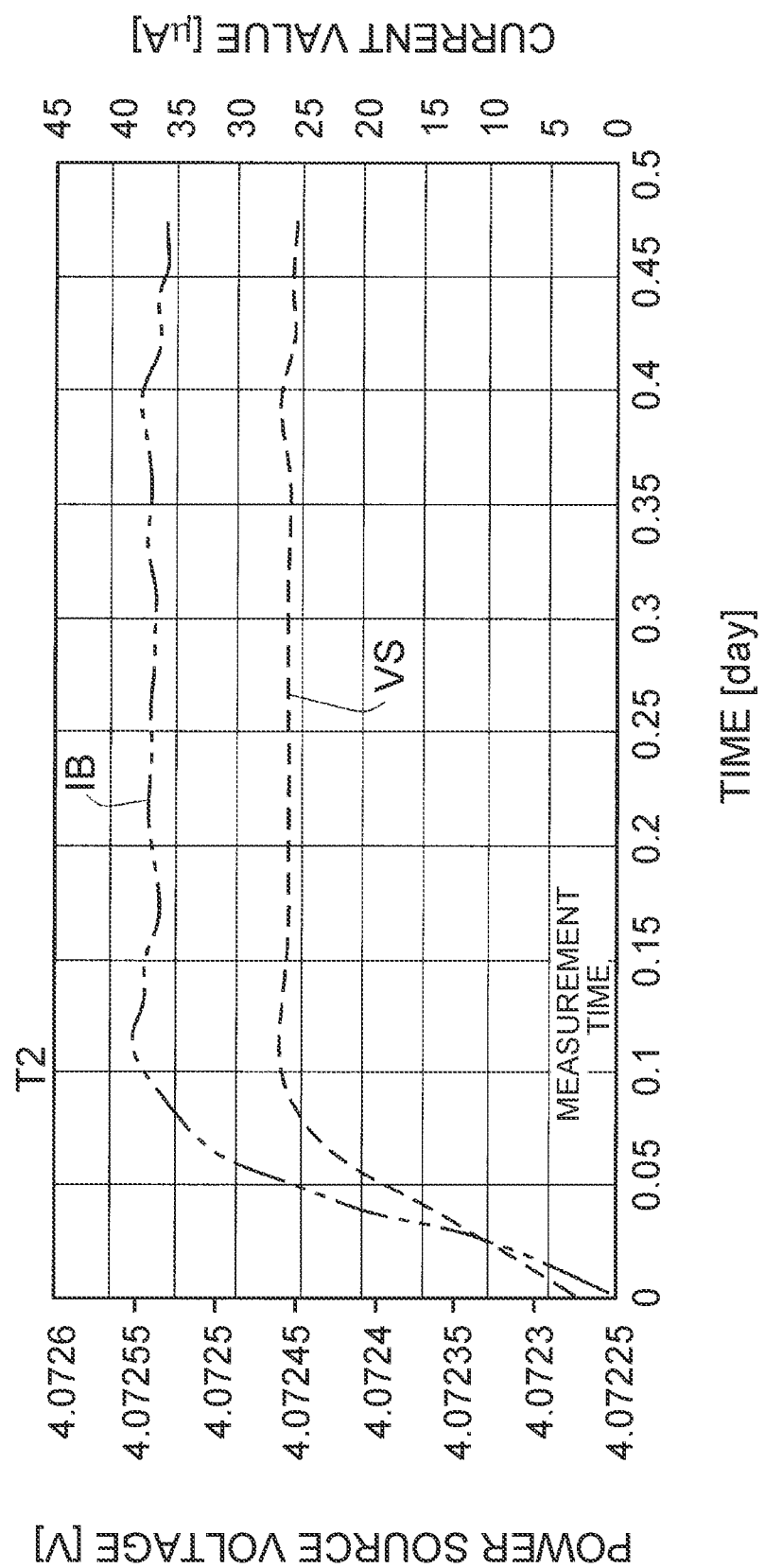
FIG. 7 is a graph showing an example of the shift of the circuit current when the output voltage is increased.

Advantages of changing the output voltage VS will be demonstrated by using FIG. 6 and FIG. 7. FIG. 6 is an example of the actual shift of the circuit current IB when the output voltage VS is held constant as described above. In the example of FIG. 6, the output voltage VS is held constant at the initially determined value, and it takes about 1.5 days for the circuit current IB to converge (time T2). The example in FIG. 6 is an example of measurement under the following conditions:

Battery capacity: 4 Ah
Positive electrode active material: Ternary lithium compound
Negative electrode active material: Graphite
Environmental temperature: 25° C.

While 1.5 days of FIG. 6 are sufficiently short compared with the time required for determination based on voltage measurement, changing the output voltage VS can further reduce the required processing time. FIG. 7 is an example for this case. In the example of FIG. 7, the output voltage VS is increased and the circuit current IB converges in as short a time as 0.1 days. Although the same measurement conditions as in the case of FIG. 6 are used in the example of FIG. 7, the initial value of the output voltage VS and the circuit current IB (IBs) upon convergence in FIG. 6 and those in FIG. 7 do not match due to the difference between the individual secondary batteries 1 being measured. The example of measurement of FIG. 7 deals with a non-defective secondary battery 1; the circuit current IB (IBs) upon convergence would have an even higher value in a defective secondary battery 1.

The case where the output voltage VS is increased as in FIG. 7 will be further described. First, the circuit current IB in the circuit 3 of FIG. 1 is given by the following Formula (1) from the output voltage VS of the measurement device 2, the battery voltage VB, and a parasitic resistance Rx:

$$IB=(VS-VB)/Rx \quad (1)$$

Here, when the output voltage VS is held constant, the circuit current IB increases as the battery voltage VB decreases due to self-discharge of the secondary battery 1 as described above. When the circuit current IB has increased to be equal to the self-discharge current ID, the secondary battery 1 virtually stops discharging. As a result, both the battery voltage VB and the circuit current IB subsequently remain constant (VB2, IBs) as described above. Thus, the circuit current IBs upon convergence indicates the self-discharge current ID of the electromotive element E of the secondary battery 1.

Formula (1) holds true also when the output voltage VS is increased. However, as the output voltage VS is increased, the circuit current IB increases more rapidly than when the output voltage VS is constant. Accordingly, it takes a shorter time for the circuit current IB to become equal to the self-discharge current ID. This is why the circuit current IB converges quickly as described above. However, thoughtlessly increasing the output voltage VS may result in an excessive increase. Then, the circuit current IB would not appropriately converge, making determination impossible. Therefore, how much to increase the output voltage VS needs to be restricted. Specifically, in this embodiment, the output voltage VS is increased within such a range that the parasitic resistance Rx in Formula (1) is seemingly reduced. This is because when the parasitic resistance Rx is reduced, the circuit current IB increases accordingly.

This embodiment introduces the concept of the imaginary resistance Rim as shown in FIG. 1. The imaginary resistance Rim is an imaginary resistance having a negative or zero resistance value. In the circuit diagram of FIG. 1, the imaginary resistance Rim is inserted in series with the parasitic resistance Rx. Although such a resistance does not exist in reality, the idea is to consider how the output voltage VS increases by using, as a substitute, a model in which the output voltage VS is held constant and instead the absolute value of the resistance value of the imaginary resistance Rim is increased. The sum of the parasitic resistance Rx and the imaginary resistance Rim decreases but must remain positive. Hereinafter, the sum of the parasitic resistance Rx and the imaginary resistance Rim will be referred to as a quasi-parasitic resistance Ry. The circuit current in a model incorporating the quasi-parasitic resistance Ry is expressed by the following Formula (2):

$$IB=(VS-VB)/(Rx+Rim) \quad (2)$$

It is assumed here that the parasitic resistance Rx is 5Ω. Then, the circuit current IB differs between when the imaginary resistance Rim is 0Ω and when the imaginary resistance Rim is −4Ω. Specifically, from Formula (2), the circuit current IB when the imaginary resistance Rim is −4Ω (corresponding to that after the start of measurement) is five times as high as the circuit current IB when the imaginary resistance Rim is 0Ω (corresponding to that at the start of measurement). This is because the quasi-parasitic resistance Ry (=Rx+Rim) when the imaginary resistance Rim is −4Ω is a fifth of the quasi-parasitic resistance Ry when the imaginary resistance Rim is 0Ω.

The above Formula (2) can be transformed into the following Formula (3):

$$VS=VB+(Rx+Rim)*IB \quad (3)$$

Formula (3) shows that adding the product of the quasi-parasitic resistance Ry and the circuit current IB to the battery voltage VB yields the output voltage VS. Since the imaginary resistance Rim of the quasi-parasitic resistance Ry does not exist in reality as described above, Formula (3) is satisfied by increasing the output voltage VS to a voltage obtained by adding the product of the parasitic resistance Rx and the circuit current IB to the battery voltage VB. Thus, a value obtained by dividing the increase in the output voltage VS by the circuit current IB corresponds to the absolute value of the imaginary resistance Rim. The value of the parasitic resistance Rx may be a known value that is measured in advance for the individual measurement device 2 and stored in the voltage control unit 11.

When measurement is started with the output voltage VS matching the initial battery voltage VB1 as described above, the output voltage VS is increased based on Formula (3), with appropriate frequency and according to the circuit current IB at that point. Thus, the increase in the output voltage VS becomes larger as the increase in the circuit current IB after the start of the test is larger. The increase in the output voltage VS converges when the increase in the circuit current IB converges. In this way, the measurement as shown in FIG. 7 can be realized. Hereinafter, thus increasing the output voltage VS based on the values of the parasitic resistance Rx and the circuit current IB will be referred to as feedback. The feedback is included in the control function of the voltage control unit 11.

The increase in the output voltage VS relative to the increase in the circuit current IB is the product of the parasitic resistance Rx and the circuit current IB based on the above description. Therefore, when the increase in the output voltage VS is represented by ΔVS, the increase ΔVS is given by the following Formula (4):

$$\Delta VS = Rx*IB \qquad (4)$$

However, the increase ΔVS is not limited to this example, and may instead be a value obtained by multiplying the product of Formula (4) by a coefficient K that is a positive value smaller than 1. The specific value of the coefficient K is an arbitrary value within this range and can be determined in advance. Thus, the increase ΔVS can be alternatively calculated by the following Formula (5):

$$\Delta VS = K*Rx*IB \qquad (5)$$

The product of the coefficient K and the parasitic resistance Rx may be obtained in advance as a constant M, and the increase ΔVS in the output voltage VS may be calculated by multiplying the circuit current IB by the constant M. In this case, the output voltage VS in the course of the test is calculated by the following Formula (6):

$$VS = VB + M*IB \qquad (6)$$

In the following, the frequency with which the feedback is performed will be described. In general, the circuit current IB can be made to converge more quickly as the feedback frequency is higher. This is because the quasi-parasitic resistance Ry can be thereby maintained to be very close to zero. However, there is also a downside to high feedback frequency. Disadvantages of high feedback frequency include the following:

The burden of controlling the output voltage VS is heavy. In some cases, the control lags behind due to the low performance of the voltage control unit 11 or of the low followability of the direct-current power source 4. In this case, an intended output voltage VS cannot be produced.

The feedback control is susceptible to a temporary change in the battery voltage VB. For example, when the battery voltage VB temporarily changes due to an external factor, such as an environmental temperature, the circuit current IB also changes under the influence of that change. If this temporary change in the circuit current IB is reflected in the result of feedback computation, a circuit current IB exceeding the self-discharge current ID of the secondary battery 1 flows and makes the circuit 3 unstable.

The feedback frequency in this embodiment is set with these disadvantages taken into account, so as to be able to stably reduce the converging time of the circuit current IB. Specifically, the feedback is performed with higher frequency at an early stage of a current measurement period, and this feedback frequency is reduced at a late stage.

Figure 8:
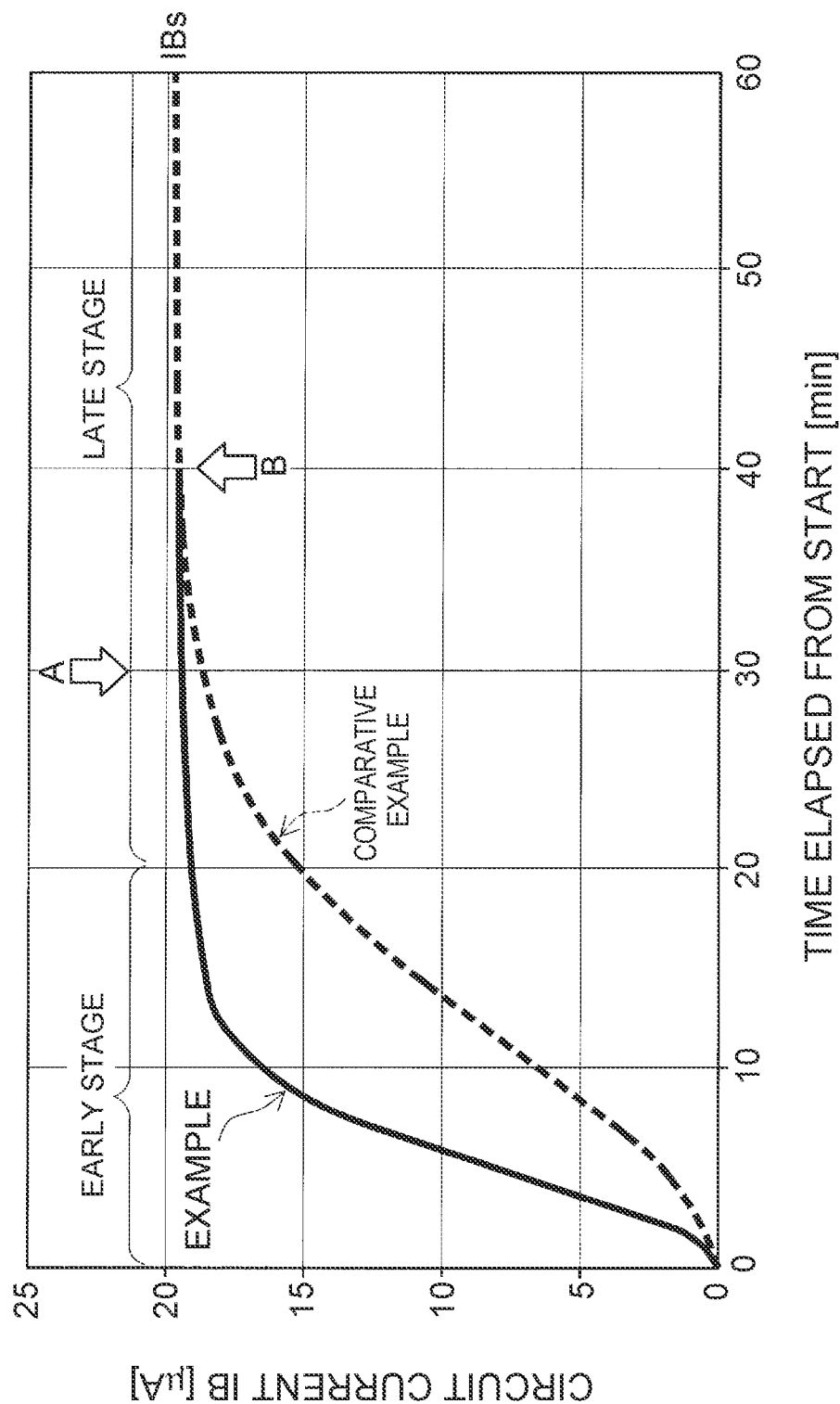
FIG. 8 is a graph showing changes over time in current when a feedback interval is controlled in the embodiment.

FIG. 8 shows an example of how the circuit current IB changes under this control. In the graph of FIG. 8, the solid curve represents an example in which the feedback interval is controlled as described above. The dashed curve represents a comparative example in which the feedback interval is fixed at a long interval (low frequency). In the example (solid line) in FIG. 8, the period from the start of measurement of the circuit current IB until 20 minutes have elapsed is defined as an early period (early stage), and the feedback interval during this period is set to 10 seconds. The period after the lapse of 20 minutes is defined as a late period (late stage), and the feedback interval during this period is set to 60 seconds. In the comparative example (dashed line), the feedback interval is set to 60 seconds throughout the measurement from immediately after the start thereof. The graph of FIG. 8 shows an example of the case where the battery type of the secondary battery 1 is a lithium-ion secondary battery, the initial battery voltage VB1 is 4 V, and the short-circuit resistance Rp is 200 kΩ.

In the example (solid line) in FIG. 8, the circuit current IB rises quickly after the start of measurement and converges at a point at which about 30 minutes have elapsed (arrow A). Convergence of the circuit current IB at such an early point is an effect of performing the feedback with high frequency during the early period as described above. In the early period shortly after the start of measurement, there is a gap between the circuit current IB at that point and the circuit current IBs upon convergence. Therefore, executing the feedback is highly effective in promoting the convergence of the circuit current IB. That there is a gap between the circuit current IB and the circuit current IBs upon convergence means that instability of the circuit current IB, which is one of the above-described disadvantages of the feedback, is less likely to occur. To put it in another way using the concept of the imaginary resistance Rim, the absolute value of the imaginary resistance Rim is less likely to become equal to or higher than the parasitic resistance Rx.

On the other hand, once in the late period, the circuit current IB is considerably close to the circuit current IBs upon convergence. This means that there is an increased risk of the imaginary resistance Rim becoming excessive. Therefore, the feedback frequency is reduced to avoid making the circuit current IB unstable. On the other hand, that the circuit current IB is close to the circuit current IBs upon convergence means that the extent to which the circuit current IB can yet be increased is small, and that executing the feedback is less effective. Thus, this embodiment takes full advantage of the effect of the feedback, and at the same time averts the disadvantages of the feedback.

In the comparative example (dashed line) in FIG. 8, by contrast, the feedback frequency is low also during the early period. Accordingly, the effect of the feedback is insufficient and the converging time is as long as 40 minutes (arrow B). If the feedback frequency is kept high also during the late period, the risk of the circuit current IB becoming unstable increases as described above.

In the example (solid line) in FIG. 8, the feedback interval is set to two levels (two types of the feedback interval are used), and the time to switch between the two feedback intervals is fixed at the time (time at which 20 minutes have elapsed) earlier than time at which 30 minutes have elapsed (time at which the circuit current IB is expected to converge when the feedback is performed on a non-defective secondary battery 1 with high frequency). However, various modifications can be made in this respect. Three or more levels of the feedback interval may be used. In particular, it is desirable that two levels of the feedback interval be used during the early period in which the feedback interval is shorter, rather than during the late period in which the feedback interval is longer. In this case, of course, each of the plurality of levels of the feedback interval used during the early period is shorter than the feedback interval used during the late period. Within the early period, first a shorter feedback interval and then a longer feedback interval is used.

Other than fixing the time of transition from the early period to the late period, it is also conceivable to determine this time of transition according to the actual state of the increase in the circuit current IB. Both the solid line (example) and the dashed line (comparative example) in FIG. 8 are similar in the shape of line to a simple step response in an RC circuit. It is therefore possible to determine whether or not the time of convergence is approaching by a technique, such as monitoring a differential value or a secondary differential value of the current value. Some kind of indicator for determining that the time of convergence is approaching may be set in advance based on the state of the increase in the circuit current IB. Transition from the early period to the late period may be made when it is determined based on this indicator that the time of convergence is approaching.

Figure 9:
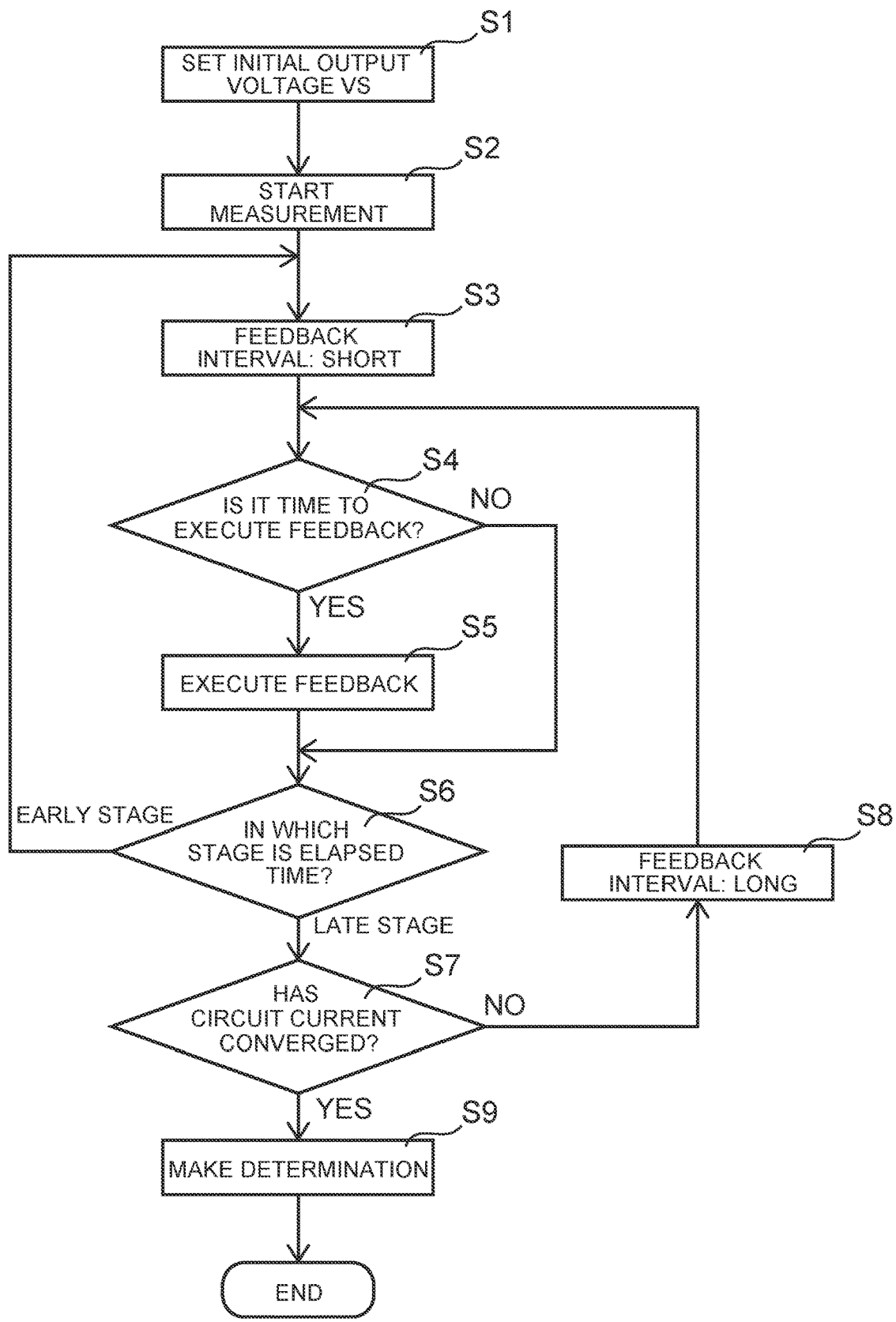
FIG. 9 is a flowchart for performing feedback control and determination control in the embodiment.

FIG. 9 shows an example of a flowchart used to make a defective-or-not-defective determination based on the circuit current IB while performing the feedback control represented by the solid line (example) in FIG. 8. The workflow of FIG. 9 is started when an initial value of the output voltage VS of the direct-current power source 4 is set (S1). As described above, the initial value of the output voltage VS set here is basically set so as to match the initial battery voltage VB1 that is the initial value of the battery voltage VB of the secondary battery 1. However, this is not essential. The embodiment of the present disclosure is valid even when the initial value of the output voltage VS does not match the initial battery voltage VB1. Even when the initial value of the output voltage VS is a voltage not matching the initial battery voltage VB1, all the same, the circuit current IB converges as the measurement of the circuit current IB is performed and the convergence is accelerated by the feedback.

However, setting the output voltage VS so as to match the initial battery voltage VB1 as a target can avoid a situation where the initial value of the output voltage VS is too low or too high relative to the initial battery voltage VB1. Too low or too high an initial value of the output voltage VS is not preferable. If the initial value of the output voltage VS is too low, it takes a long time for the circuit current IB to converge, even when the feedback control is performed. On the other hand, when the initial value of the output voltage VS is too high, the circuit current IB may not stabilize from the beginning and may fail to converge.

When the initial value of the output voltage VS has been set, measurement of the circuit current IB is started (S2). Specifically, the output voltage VS of the direct-current power source 4 is applied to the circuit 3. This time is the time at the left end (zero minutes) on the horizontal axis in FIG. 8. When the current measurement is started, the feedback interval is set. At this point, a short interval (10 seconds in the above example) is set (S3). Then, it is determined whether or not the time to execute the feedback has come (S4). The time to execute the feedback is the time when the time elapsed from the last execution of the feedback reaches the set feedback interval. For the initial feedback, this time is the time when the time elapsed from the start of measurement in step S2 reaches the feedback interval.

When it is determined "Yes" in step S4, the above-described feedback is executed (S5). Specifically, the increase $\Delta VS$ in the output voltage VS is calculated by Formula (4) or (5), based on the circuit current IB at that point and the parasitic resistance Rx in the circuit 3. Based on the calculation result, the output voltage VS of the direct-current power source 4 is increased. When it is determined "No" in step S4, step S5 is skipped. Thus, the feedback is not performed at this point.

Then, the time elapsed from the start of measurement in step S2 is checked (S6). This is to determine whether the current time is still in the "early stage" or already in the "late stage" in FIG. 8. When the current time is still in the "early stage," the workflow returns to step S3. Thus, the feedback is repeatedly executed at the short feedback interval, without changing the setting of the feedback interval. Accordingly, the circuit current IB increases rapidly as indicated by the solid curve in FIG. 8.

When the "late stage" in FIG. 8 is reached as the measurement continues, the workflow moves to step S7 after step S6, instead of returning to step S3. In step S7, it is determined whether or not the circuit current IB has converged. As described above, this determination is made by using some kind of known indicator. When the circuit current IB has not yet converged (S7: No), a long feedback interval (60 seconds in the above example) is set (S8). Then, the workflow returns to step S4. Thus, the feedback is subsequently repeatedly executed with the setting of the long feedback interval, to wait for the circuit current IB to converge.

When the circuit current IB has converged (S7: Yes), the workflow moves to determination in step S9. Specifically, it is determined by the determination unit 12 whether the secondary battery 1 is a defective product or a non-defective product based on the circuit current IBs upon convergence. This determination can be made, for example, by setting in advance the reference value IK for the circuit current IBs upon convergence as described above. In this way, the determination in this embodiment is made. While FIG. 9 shows the case where the feedback interval has two levels of short and long intervals, a workflow can be created also for the case where three or more levels of the feedback interval are used.

Figure 10:
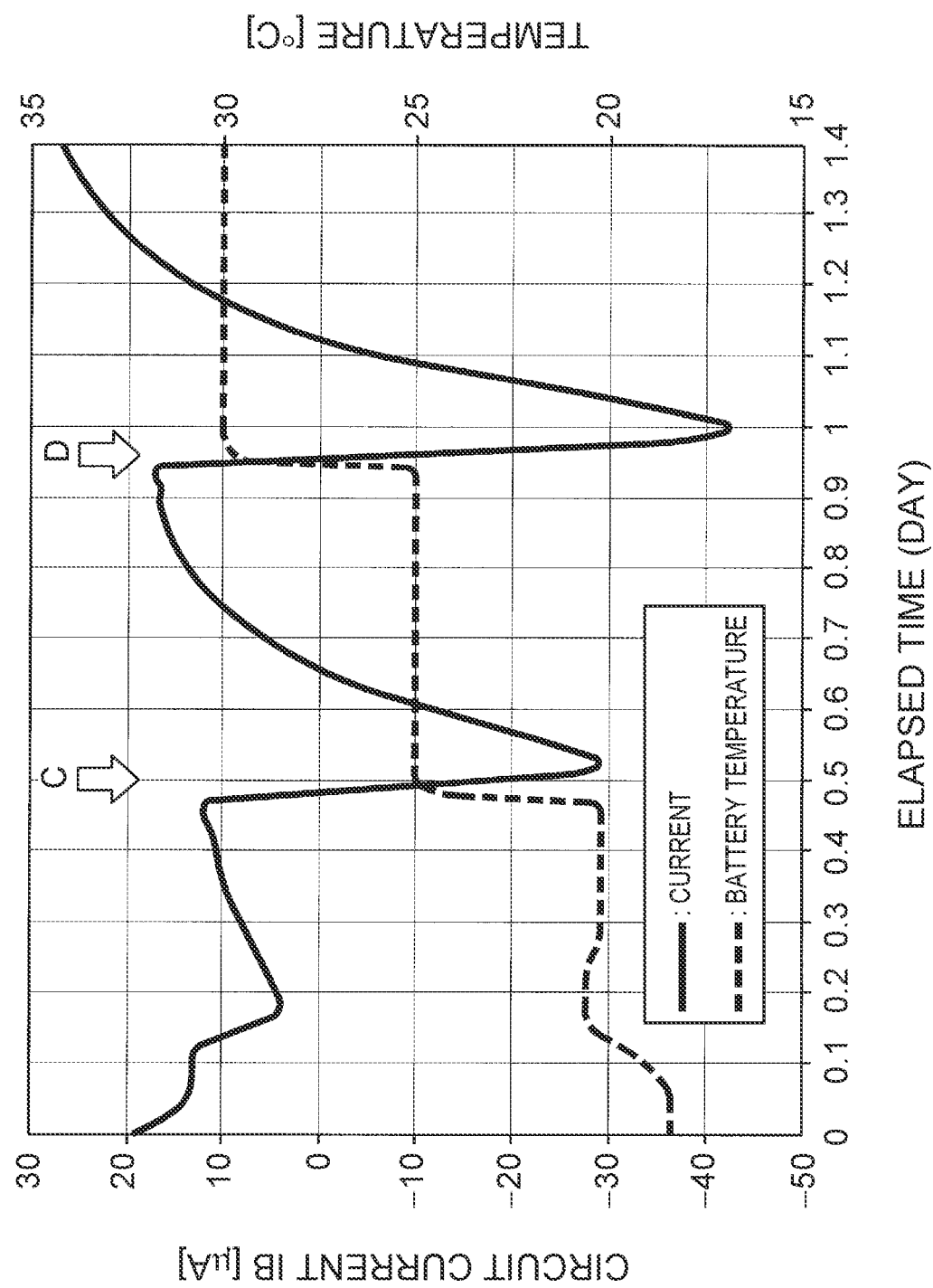
FIG. 10 is a graph showing an example of changes in circuit current when a battery temperature changes.

It is desirable that the current measurement in the embodiment as described above be performed with the environmental temperature held constant. This will be described by using FIG. 10. FIG. 10 shows a state where the temperature of the secondary battery 1 is changed while the circuit current IB in the circuit 3 is measured. In the graph of FIG. 10, the circuit current IB (solid line) and the temperature of the secondary battery 1 (dashed line) are plotted. At the points indicated by arrows C and D, the temperature of the secondary battery 1 undergoes stepwise changes. These are caused by intentionally changing the temperature through manipulation from outside.

In FIG. 10, the circuit current IB undergoes rapid changes at the points indicated by arrows C and D. Thus, it can be seen that a change in the battery temperature has an influence on the circuit current IB. A change in the battery temperature during the measurement in FIG. 8 is not preferable. Such a change may affect the feedback control, the determination of convergence, and the defective-or-not-defective determination. It is therefore desirable that the current measurement in FIG. 8 be performed with the temperature of the secondary battery 1 held constant. To realize this, it is conceivable, for example, to place the entire secondary battery 1 shown in FIG. 1 inside a temperature-controlled room for measurement. In FIG. 10, the circuit current IB changes slowly except at the points indicated by arrows C and D. This change represents the above-described change in the battery voltage VB due to self-discharge of the secondary battery 1.

It is desirable that the current measurement in this embodiment be performed with the secondary battery 1 being restrained. When no restraining load is exerted on the secondary battery 1, the distance between the positive and negative electrode plates inside the electrode stack 20 is not uniform. Therefore, even when a small metallic foreign object is present inside the battery, this foreign object may not exhibit an influence. This may be the case when there is a small metallic foreign object at a position where the distance between the electrode plates is long. In this case, when current measurement is performed without the secondary battery 1 being restrained, the result of the defective-or-not-defective determination is highly likely to be "not defective."

However, when actually used, this secondary battery 1 may be found to be a defective product that discharges quickly. In particular, the flat rectangular secondary battery 1 as shown in FIG. 2 is actually used often in a state of being restrained with a compressive load exerted thereon in a thickness direction. Thus, a small metallic foreign object that has not formed a self-discharge path during the test may form a self-discharge path during actual use. The likelihood of such a situation can be eliminated by performing current measurement with the secondary battery 1 being restrained.

FIG. 11 is a graph showing a relation between a restraining force and the thickness of the secondary battery 1 when the battery is restrained. The vertical axis in FIG. 11 represents a ratio of a decrease in the thickness to an increase in the restraining force. Thus, a large value on the vertical axis of the graph of FIG. 11 means that slightly increasing the restraining force results in a significant decrease in thickness of the battery. Conversely, a small value on the vertical axis means that further increasing the restraining force results in little change in thickness of the battery. It can be seen from FIG. 11 that the ratio of the decrease in thickness is high while the restraining force is small but this ratio is extremely low, i.e., the thickness of the battery is substantially constant, when the restraining force is equal to or larger than 4 kN (zone F). It is supposed that applying this level of restraining force will cause a small metallic foreign object inside the battery to form a self-discharge path without fail.

In most cases, the restraining load exerted on the secondary battery 1 during actual use is a load corresponding to that in zone F of FIG. 11. It is therefore desirable that current measurement be performed with a restraining load corresponding to that in zone F being applied to the secondary battery 1. Thus, the likelihood that a battery that will turn out to be a defective product during actual use may be determined to be a non-defective product can be eliminated. To restrain the secondary battery 1, for example, a binding member 130 shown in FIG. 12 can be used to bind the secondary batteries 1 along with spacers 160 to form a bound assembly 100.

As has been described in detail above, whether or not the secondary battery 1 is defective is tested in this embodiment by measuring the circuit current IB and using the state of convergence thereof as a basis. Here, the feedback control is performed on the output voltage VS based on a measured value of the circuit current 1B to allow for quick convergence of the circuit current IB. The feedback frequency during the feedback control is set to be higher at the early stage of the current measurement and lower at the late stage of the current measurement, so as to take full advantage of the convergence promoting effect and at the same time avoid the risk of an excessive voltage. Thus, a testing method of the secondary battery 1 by which whether or not the secondary battery 1 is defective can be quickly determined with high accuracy is realized.

Further, a secondary battery manufacturing method featuring the secondary battery testing method of the embodiment is realized in which a charged secondary battery 1 is obtained by initially charging a newly assembled, uncharged secondary battery 1 until a predetermined state of charge is reached, and then the above testing method is performed on the charged secondary battery 1. The assembly of the secondary battery 1 involves housing the electrode stack 20 inside the outer casing 10 (see FIG. 2), pouring an electrolyte into the outer casing 10, and then sealing the outer casing 10.

This embodiment is merely illustrative and in no way limits the present disclosure. Therefore, various improvements and modifications can of course be made to the present disclosure within the scope of the gist of the disclosure. For example, step S9 in the workflow of FIG. 9 has been described using an example in which a determination is made based on the reference value IK set for the circuit current IBs upon convergence. However, the present disclosure is not limited to this example, and it is also conceivable to set an upper limit value (e.g., about 40 minutes) for the elapsed time in FIG. 8. In this case, if the circuit current IB has not converged when the elapsed time has reached the upper limit value, the secondary battery 1 can be determined as a defective product without the need to wait for convergence. It is also conceivable to set a shorter time (e.g., about 25 minutes) as this upper limit value such that a defective-or-not-defective determination can be made based only on whether or not the circuit current has converged within the upper limit value, without making a determination based on the reference value IK.

In the workflow of FIG. 9, the first feedback is performed after waiting for a time corresponding to one feedback interval. However, the present disclosure is not limited to this example, and the first feedback may be performed immediately after the start of measurement. The object of the testing method of the embodiment is not limited to a secondary battery immediately after being manufactured as a new product, and this method can also be performed on a used secondary battery, for example, for the purpose of remanufacturing processing of a spent battery pack. The electricity storage device to be determined is not limited to a secondary battery but may also be a capacitor, such as an electric double-layer capacitor or a lithium-ion capacitor.

What is claimed is:

1. An electricity storage device testing method in which whether or not an electricity storage device being tested is defective is determined based on a value of a current flowing through a closed circuit built by connecting a power source to the electricity storage device, the method comprising:

a circuit building step of building the closed circuit by connecting an external power source to a charged electricity storage device such that a direction of voltage of the external power source is opposite from a direction of voltage of the electricity storage device;

a current measuring step of measuring the value of the current flowing through the closed circuit while applying to the closed circuit a voltage in the opposite direction from the direction of voltage of the electricity storage device by the external power source; and a feedback computing step of calculating a voltage to be output by the external power source in the current measuring step, based on the value of the current measured in the current measuring step and a resistance value of the closed circuit, wherein, in the current measuring step, the output voltage of the external power source is changed according to the calculated voltage in the feedback computing step, and wherein the feedback computing step is performed with higher frequency in a first stage of the current measuring step than in a second stage of the current measuring step, the first stage being a period before the second stage.

2. The electricity storage device testing method according to claim 1, wherein a transition time from the first stage to the second stage of the current measuring step is earlier than a time that the value of the current is expected to converge, and the time that the value of the current is expected to converge is when the value of the current would converge for a non-defective electricity storage device when performing the feedback computing step at the higher frequency.

3. The electricity storage device testing method according to claim 1, further comprising an output voltage setting step of, before starting the current measuring step, setting an initial output voltage of the external power source so as to match an initial voltage of the electricity storage device as a target.

4. An electricity storage device manufacturing method comprising:

an initial charging step of obtaining a charged electricity storage device by initially charging an assembled and uncharged electricity storage device until a predetermined state of charge is reached; and a testing step of testing the charged electricity storage device by the electricity storage device testing method according to claim 1.

* * * * *